(12) United States Patent
Pekarik et al.

(10) Patent No.: US 10,910,308 B2
(45) Date of Patent: Feb. 2, 2021

(54) DUAL THICKNESS FUSE STRUCTURES

(71) Applicant: GLOBALFOUNDRIES INC., Grand Cayman (KY)

(72) Inventors: John J. Pekarik, Underhill, VT (US); Anthony K. Stamper, Burlington, VT (US); Vibhor Jain, Essex Junction, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 15/975,041

(22) Filed: May 9, 2018

(65) Prior Publication Data
US 2019/0348365 A1    Nov. 14, 2019

(51) Int. Cl.
| | | |
|---|---|---|
| H01L 23/52 | (2006.01) | |
| H01L 23/525 | (2006.01) | |
| H01L 21/768 | (2006.01) | |
| H01L 23/00 | (2006.01) | |
| H01L 23/62 | (2006.01) | |

(52) U.S. Cl.
CPC .... *H01L 23/5258* (2013.01); *H01L 21/76843* (2013.01); *H01L 23/573* (2013.01); *H01L 23/62* (2013.01); *H01L 24/16* (2013.01)

(58) Field of Classification Search
CPC .............. H01L 23/5258; H01L 23/573; H01L 21/76843; H01L 24/16; H01L 23/62
See application file for complete search history.

(56) References Cited

U.S. PATENT DOCUMENTS

| | | | |
|---|---|---|---|
| 4,826,785 A | 5/1989 | McClure et al. | |
| 5,420,455 A | 5/1995 | Gilmour et al. | |
| 5,760,674 A | 6/1998 | Gilmour et al. | |
| 6,486,526 B1 | 11/2002 | Narayan et al. | |
| 6,498,385 B1 | 12/2002 | Daubenspeck et al. | |
| 6,667,533 B2 | 12/2003 | Daubenspeck et al. | |
| 7,183,656 B2 | 2/2007 | Luce et al. | |
| 8,921,875 B2 | 12/2014 | LeToguin et al. | |
| 8,921,975 B2 | 12/2014 | Anderson et al. | |
| 2002/0113291 A1* | 8/2002 | Adkisson ............ | H01L 23/3735 257/529 |
| 2003/0168714 A1* | 9/2003 | Daubenspeck ..... | H01L 23/5256 257/529 |
| 2004/0070049 A1* | 4/2004 | Anderson ........... | H01L 23/5256 257/529 |
| 2006/0163734 A1* | 7/2006 | Thei ..................... | H01L 23/5258 257/758 |

(Continued)

OTHER PUBLICATIONS

Taiwanese Office Action and Search Report in TW Application No. 108111936 dated Feb. 6, 2020, 11 pages.

(Continued)

*Primary Examiner* — Charles D Garber
*Assistant Examiner* — S M Sohel Imtiaz
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to dual thickness fuse structures and methods of manufacture. The structure includes a continuous wiring structure on a single wiring level and composed of conductive material having a fuse portion and a thicker wiring structure.

18 Claims, 5 Drawing Sheets

(56) References Cited

U.S. PATENT DOCUMENTS

| | | | |
|---|---|---|---|
| 2008/0006904 A1* | 1/2008 | Mun | H01L 23/5258 |
| | | | 257/530 |
| 2012/0012976 A1* | 1/2012 | Gambino | H01L 23/5258 |
| | | | 257/529 |
| 2017/0069570 A1* | 3/2017 | Yoon | H01L 28/00 |
| 2017/0162501 A1* | 6/2017 | Yi | H01L 21/76831 |
| 2019/0228936 A1* | 7/2019 | Yoneda | H01H 85/143 |

OTHER PUBLICATIONS

Taiwanese Notice of Allowance in TW Application No. 108111936 dated Aug. 6, 2020, 4 pages.

* cited by examiner

DUAL THICKNESS FUSE STRUCTURES

FIELD OF THE INVENTION

The present disclosure relates to semiconductor structures and, more particularly, to dual thickness fuse structures and methods of manufacture.

BACKGROUND

Semiconductor devices such as logic circuits, e.g., complementary metal-oxide-silicon (CMOS), BiCMOS and memory devices, e.g., dynamic random access memory (DRAMs), static random access memory (SRAMs), rf circuits, high voltage circuits, etc. are designed with fuses. These fuses can be used for many different applications including, e.g., to access spare bit lines and/or word lines to repair a device and hence increase yield potential, testing types of flaws in the device, and encoding identification information on the semiconductor device, amongst other features.

Laser fuses are usually formed from narrow wires in the interconnection wiring levels in order to minimize damage to adjoining structures, to minimize the thickness of dielectric passivation covering the fuse and to allow an optically clear path for a laser. Fuses are designed to be blown (e.g., opened) by vaporizing a portion of the wire by either passing an electric current through the fuse or, more commonly, by a laser pulse. In a laser fuse, a wire has a connectivity that is broken by using a laser to locally melt the wire and form an open circuit. Wires with broken connectivity can be used for any function and not just as a fuse. For simplicity, any structure that uses a laser to break the wire connection is referred to as a laser fuse.

SUMMARY

In an aspect of the disclosure, a structure comprises a continuous wiring structure on a single wiring level and composed of conductive material having a thinner portion and a thicker wiring structure.

In an aspect of the disclosure, a structure comprises a continuous wiring structure with a planar surface, the continuous wiring structure being composed of conductive material with a thinner fuse portion on a bump of insulator material and a thicker overpass wiring structure.

In an aspect of the disclosure, a method comprises: depositing an insulator material on an underlying substrate; patterning the insulator material to form a bump and adjacent openings in the insulator material thereby exposing the underlying substrate; depositing conductive material over the bump and in the adjacent openings; and planarizing the conductive material to form a continuous wiring structure comprising a thin laser fuse portion and thicker overpass wiring structure on a same wiring level.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to dual thickness fuse structures and methods of manufacture. More specifically, the present disclosure relates to dual thickness wires where the thinner portion of the wire can be used for a laser fuse structure or a reduced pitch wiring level coincident with a larger pitch wiring level using the thicker portion of the wire and methods of manufacture. In the subsequent description, a laser fuse embodiment will be described.

More specifically, the present disclosure is related to dual thickness wire laser fuse structures and methods of manufacture. In embodiments, the dual thickness wire laser fuse structures are composed of a continuous thin wire (laser use) and thick wire (e.g., overpass wiring) in a same wiring level. Advantageously, the present disclosure provides a method of fabricating the thinner laser fuse (e.g., thinner wire) along with thicker wiring for analog applications with fewer masking steps.

In an aspect of the disclosure, a structure comprises a continuous wiring structure on a single wiring level, composed of conductive material having a thinner fuse portion and a thicker overpass wiring structure. In an aspect of the disclosure, a structure comprises a continuous wiring structure on a single wiring level, composed of conductive material having a thinner portion and a thicker portion structure. In yet another aspect of the disclosure, a structure comprises a continuous wiring structure on a single wiring level, composed of conductive material having a thinner portion and a thicker portion such that the pitch or minimum line space of the thinner portion of the wire is less than that of the thicker portion of the wire.

The dual thickness fuse structures of the present disclosure can be manufactured in a number of ways using a number of different tools. In general, though, the methodologies and tools are used to form structures with dimensions in the micrometer and nanometer scale. The methodologies, i.e., technologies, employed to manufacture the dual thickness fuse structures of the present disclosure have been adopted from integrated circuit (IC) technology. For example, the structures are built on wafers and are realized in films of material patterned by photolithographic processes on the top of a wafer. In particular, the fabrication of the dual thickness fuse structures uses three basic building blocks: (i) deposition of thin films of material on a substrate, (ii) applying a patterned mask on top of the films by photolithographic imaging, and (iii) etching the films selectively to the mask.

Figure 1A:
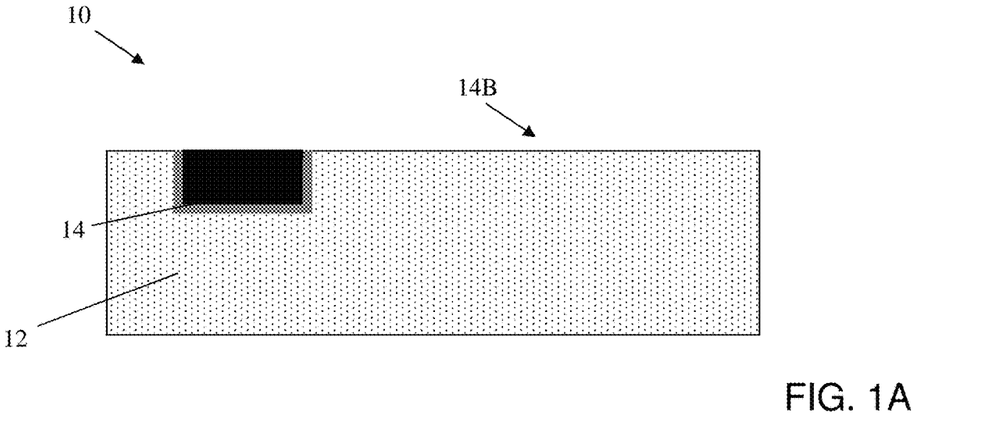
FIG. 1A shows a structure with a bump of insulator material and respective fabrication processes in accordance with aspects of the present disclosure.

FIG. 1A shows a structure 10 comprising a substrate coated with one more insulators 12 and with one or more wires 14 formed in the insulator 12. The wire 14 could be formed using damascene (shown) or subtractive etch (not shown) processes as is known in the art. If the wire 14 was formed using subtractive etch, then the subsequent dielectric over the wire 14 could be planarized to form a flat or nearly flat surface 14B prior to subsequent processing. In embodiments, the planar surface 14B could be coincident with the top of wire 14 or could be above the top of wire 14 such that the insulator 12 would extend above the top of wire 14.

Figure 1B:
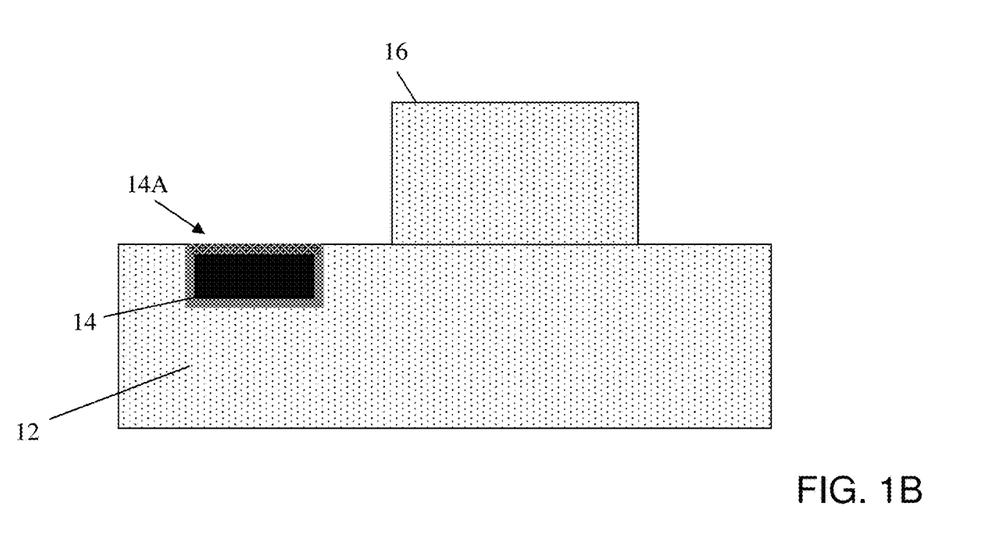
FIG. 1B shows a structure with a bump of insulator material and respective fabrication processes in accordance with aspects of the present disclosure.

FIG. 1B shows a structure with a bump (bump or peg structure) of insulator material and respective fabrication processes in accordance with aspects of the present disclosure. More specifically, FIG. 1B comprises an insulator material 12, e.g., oxide, and at least one wiring structure 14 formed in the insulator material 12. In embodiments, the at least one wiring structure 14 can be a copper wiring structure formed using conventional CMOS processes such that no further explanation is required for one of ordinary skill in the art to understand the present disclosure.

If the wire 14 is formed from copper, then a conducting or insulating cap 14A could be be formed over the wire to prevent a reaction with the subsequent films and process. A cap formed from electroless plated CoWP could be employed, although any known method of forming a cap over wire 14. Alternatively, a dielectric layer as known in the art, such as SiN or SiCN, could be deposited before depositing dielectric layer 16.

Still referring to FIG. 1B, a bump or peg structure 16 of insulator material (dielectric layer) is formed on the insulator material 12. In embodiments, the patterned structure of insulator material is an oxide material deposited using conventional blanket deposition processes, e.g., chemical vapor deposition (CVD) such as plasma enhanced CVD, a spin-on glass process, or the like, followed by a conventional lithography, etching, and resist strip processes known to those of skill in the art to form the bump or peg 16.

For example, a resist formed over the insulator material is exposed to energy (light) to form a pattern (opening). An etching process with a selective chemistry, e.g., reactive ion etching (RIE), is performed to remove portions of the insulator material (forming openings) exposed through the openings of the resist. Alternatively, a dielectric barrier (not shown) could be deposited on the planar surface 14B shown in FIG. 1A to provide an etch stop layer prior to the insulator material deposition for the etch process used to form the bump 16. The resist can then be removed by a conventional oxygen ashing process or other known stripants, leaving the bump 16 of insulator material.

Figure 2:
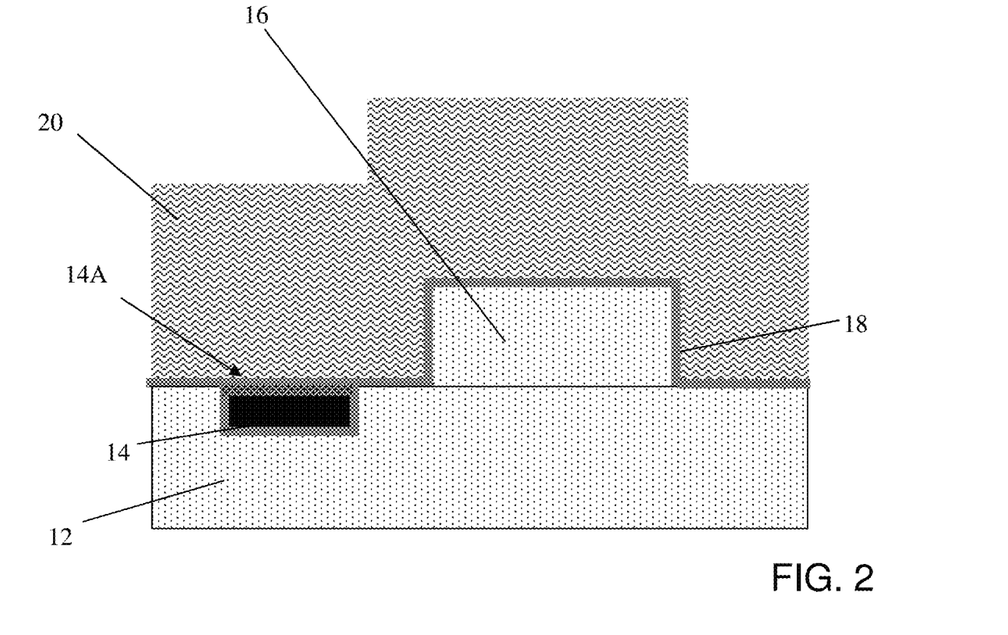
FIG. 2 shows a conductive material over the bump of insulator material, amongst other features, and respective fabrication processes in accordance with aspects of the present disclosure.

In FIG. 2, a conductive liner material 18 and conductive material 20 are formed over the bump 16 of insulator material. In embodiments, the liner material 18 is a barrier layer, e.g., Ti, Ta, TiN, TaN, W, WN, etc. as known in the art; whereas, the conductive material 20 is Al or AlCu. In embodiments, the liner material 18 is deposited by a plasma vapor deposition (PVD) process or a sputtering technique; although other deposition methods such as CVD, atomic layer deposition (ALD), and the like are also contemplated herein. The liner material 18 can be deposited to a thickness of about 10 nm to about 100 nm, as one example. The conductive material 20 can also be deposited by a PVD process or sputtering technique to a thickness of about 2 μm to about 6 μm; although other thicknesses are contemplated depending on the particular technology node and design parameters.

Figure 3:
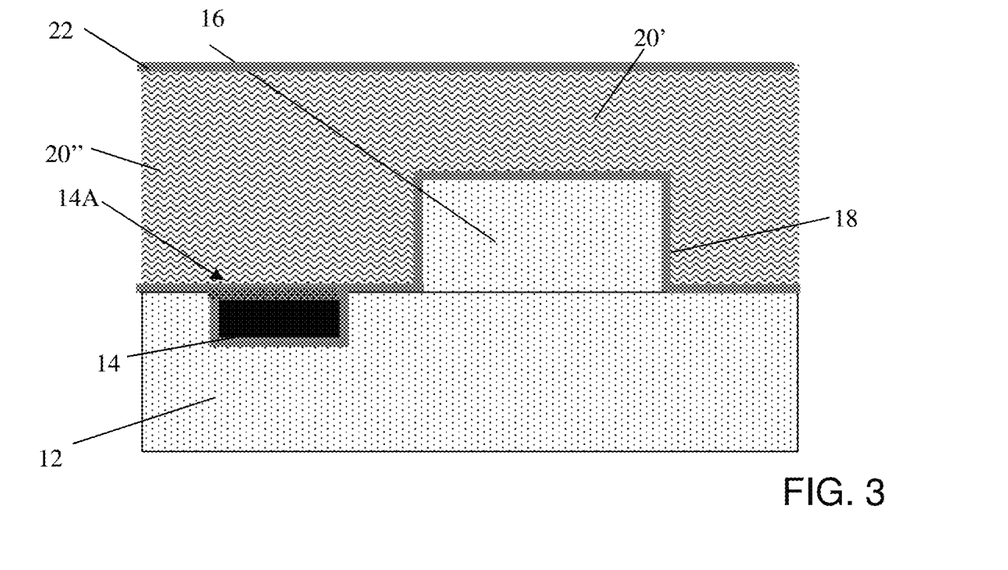
FIG. 3 shows a thin wiring structure (e.g., fuse) and a thicker wiring structure on a same wiring level, amongst other features, and respective fabrication processes in accordance with aspects of the present disclosure.

As shown in FIG. 3, the conductive material 20 undergoes a planarization process, followed by a deposition of liner material 22. In embodiments, the planarization process will result in a continuous thin wire structure (e.g., fuse) 20' and thicker wire structure (e.g., overpass wiring) 20" on a same wiring level. In embodiments, the thin wire structure 20' can have a thickness of about 0.5 μm to about 1 μm; whereas, the thicker wire structure 20" can have a thickness of about 2 μm to about 6 μm. The liner material 22 can have a thickness of about 10 nm to about 100 nm; although other dimensions are also contemplated depending on the technology node and/or desired electrical characteristics. In embodiments, the liner material can be, e.g., TiN, TaN, Ta, Ti, etc., as described for liner 18.

The planarization process of the conductive material 20 can be any conventionally known planarization processes. For example, the planarization process can be, e.g., a chemical mechanical polishing (CMP) or a reverse mask process. In the reverse mask process, for example, a mask is deposited over the conductive material 20 and patterned to expose the regions of the conductive material 20 over the bump 16. Following the mask patterning, the exposed conductive material 20 is subjected to a timed etch to remove the excess (exposed) conductive material 20. In this way, the conductive material 20 can be etched to form a planar surface. The mask material can then be removed. As another alternative, the planarization process can include a non-conformal oxide deposition, following by CMP processes of the oxide material and conductive material 20 (e.g., AlCu).

Figure 4:
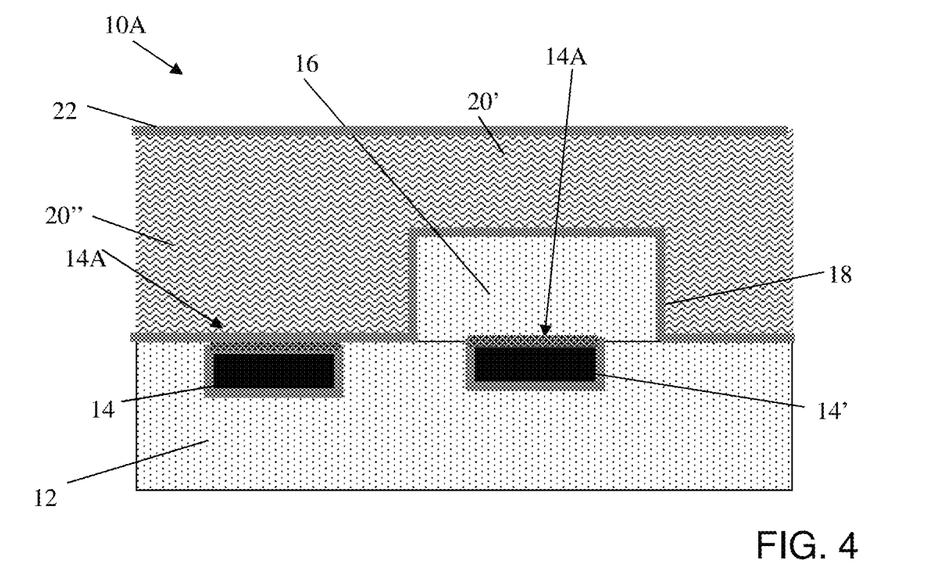
FIG. 4 shows an alternative structure and respective fabrication processes in accordance with aspects of the present disclosure.

FIG. 4 shows an alternative structure and respective fabrication processes in accordance with aspects of the present disclosure. In the structure 10A of FIG. 4, a wiring structure 14' is formed under the bump 16 prior to the bump 16 formation. The wiring structure 14' can be formed at the same time and using the same processes as the wiring structure 14. In embodiments, the wiring structure 14' can be a "bomb shelter" or wire underpass. As should be understood by one of ordinary skill in the art, the bomb shelter is a crack stop structure under the thin wiring structure (fuse) 20'.

Figure 5:
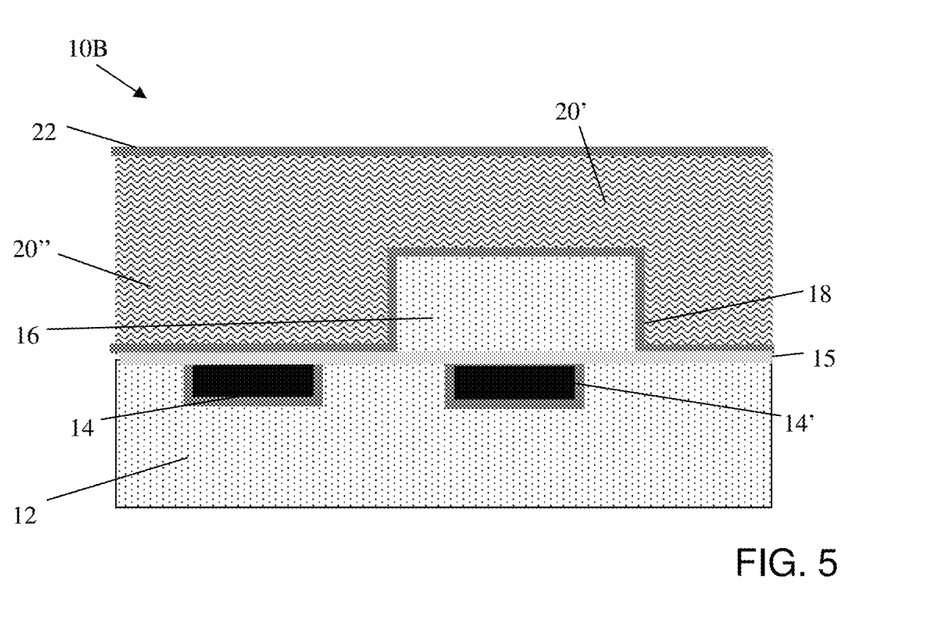
FIG. 5 shows another alternative structure and respective fabrication processes in accordance with aspects of the present disclosure.

FIG. 5 shows another alternative structure and respective fabrication processes in accordance with aspects of the present disclosure, as described above. In the structure 10B of FIG. 5, a dielectric etch stop layer such as SiN, SiCN, or similar material 15 as known in the art for capping copper wires, is located between the bump 16 and the wiring structure 14' (e.g., bomb shelter or wire underpass). In embodiments, the layer of SiN material 15 is formed by a deposition and patterning process, prior to the deposition processes to the formation of the bump 16. For example, after the formation of the wiring structures 14, 14', a layer of SiN material can be deposited using, e.g., CVD processes, followed by a patterning process to remove any excess SiN material on the insulator material 12. Next, the insulator material for the bump 16 can be deposited and patterned, followed by the steps of FIG. 2.

Figure 6:
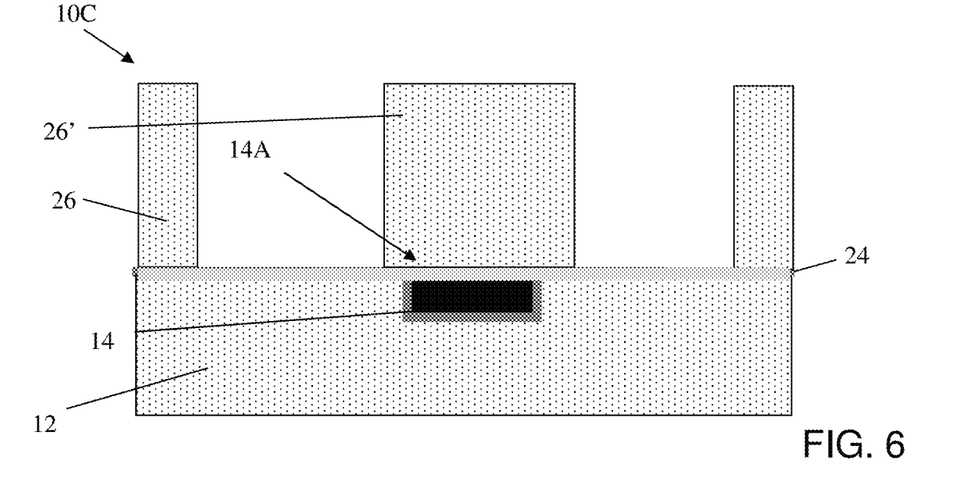
FIGS. 6-8 show yet another alternative structure and respective fabrication processes according to aspects of the present disclosure.
Figure 7:
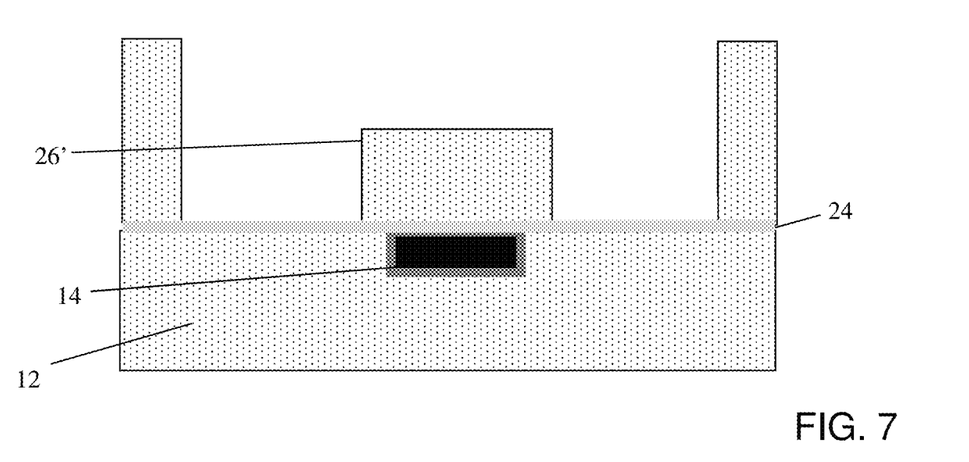
Figure 8:
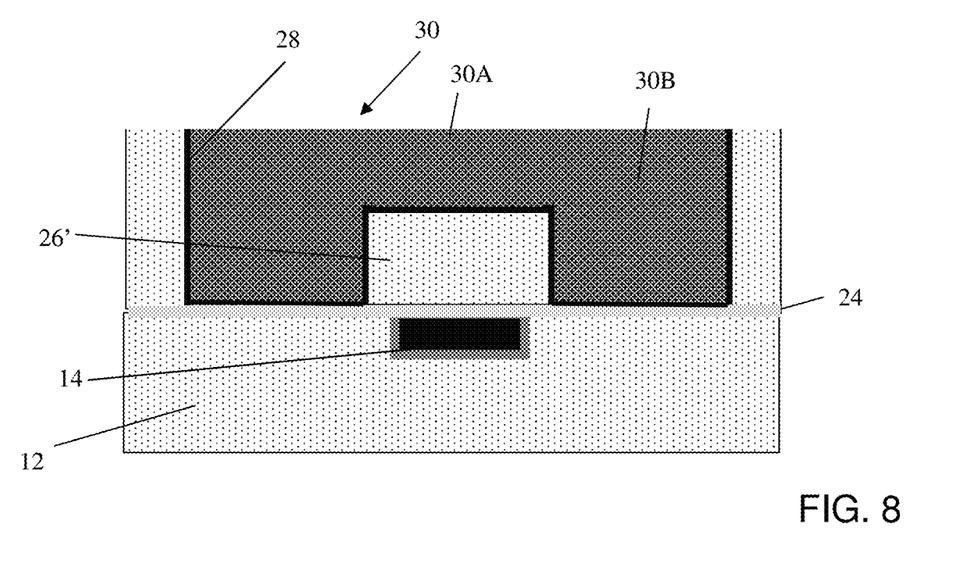

FIGS. 6-8 show an alternative structure and respective fabrication processes according to aspects of the present disclosure. For example, in FIG. 6, the structure 10C comprises an insulator material 12, e.g., oxide, and at least one optional wiring structure 14 formed in the insulator material 12. In embodiments, the at least one wiring structure 14 can be a copper wiring structure formed using conventional CMOS processes such that no further explanation is required for one of ordinary skill in the art to understand the present disclosure.

Still referring to FIG. 6, a barrier layer 24 is deposited on the insulator material 12 and over the at least one wiring structure 14. In embodiments, the barrier layer 24 is SiN or similar film deposited by conventional deposition processes, e.g., CVD, to a thickness of about 50 nm to 100 nm; although other dimensions are also contemplated based on particular technology nodes. An insulator material 26, e.g., oxide material, is deposited on the barrier layer 24 using conventional deposition processes, e.g., CVD. In this embodiment, layer 24 also caps wire 14 to prevent copper damage or diffusion when the insulator layer 26 is deposited. The insulator material 26 is patterned by conventional lithography and etching processes as already described herein. In embodiments, the patterning process will expose the barrier layer 24 on opposing sides of the at least one wiring structure. That is, in a particular embodiment, the insulator material 26' can be patterned to remain over the at least one wiring structure 14.

In FIG. 7, a portion of the insulator material 26' is recessed (e.g., forming a bump or peg structure) by an etching process. The etching process can be a timed etch using another masking process, with the barrier layer 24 providing protection to the underlying insulator material 12. After the recessing of the insulator material 26', the barrier layer 24 can be removed by another etching process. Alternatively, the insulator material 26 can be recessed at the same time as the removal of the barrier layer 24 in a single etching process. In any scenario, the removal of the barrier layer 24 will expose the underlying insulator material 12.

Referring to FIG. 8, a liner, such as Ta, and copper seed layer 28 as known in the art are deposited on the exposed insulator material 12 and the surfaces of the insulator material 26, 26'. In embodiments, the seed layer 28 is Ta deposited to a thickness of about 30 nm to about 50 nm. In embodiments, the seed layer 28 can be deposited by a PVD or sputter technique, as examples. A conductive material 30 is deposited on the seed layer 28. In embodiments, the seed layer 28 and the conductive material 30 is a copper material deposited by an electroplating process. The conductive material 30 undergoes a CMP process to form a continuous thin wire structure 30A (fuse) and a thick wire structure 30B (e.g., overpass wiring) on a same wiring level. In embodiments, the thin wire structure 30A can have a thickness of about 0.5 µm to about 1 µm; whereas, the thicker wire structure 30B can have a thickness of about 3 µm to about 4 µm.

Figure 9:
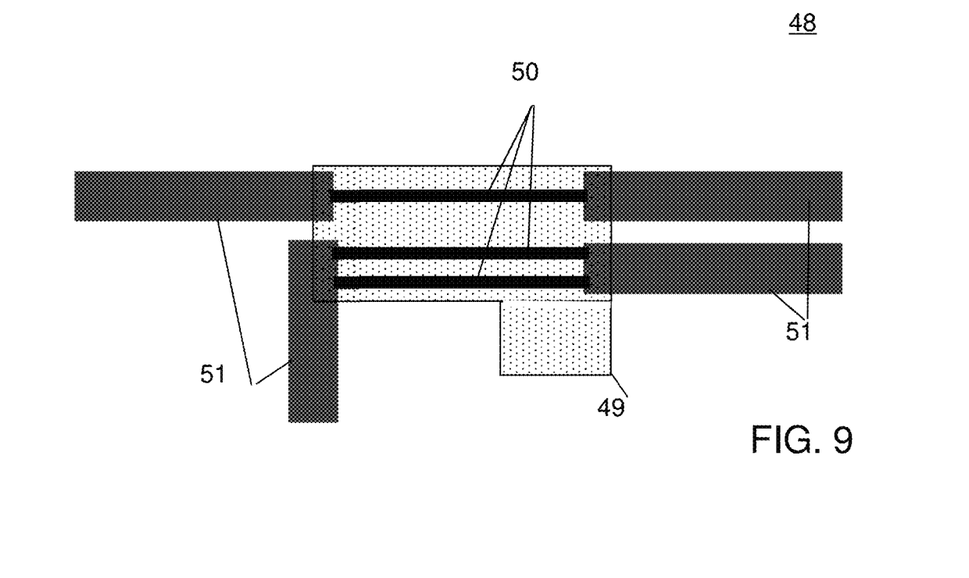
FIG. 9 shows a top view of a wiring layer with different pitches, amongst other features.

All of the methods and structures defined in the disclosure provide a single wiring level with multiple wire heights. The thinner wire that is used as a laser fuse could also be used for any wiring function and could also be lithographically patterned using a tighter pitch or smaller width process. For example, FIG. 9 shows a top view of a wire containing a thick region 48 and thin region 49 with wires of a tight pitch 50 and relaxed pitch 51. The tight pitch wires are formed using a high resolution lithographic process with thinner photoresist and the relaxed pitch wires are formed using a lower resolution lithographic process with thicker photoresist. The tight and relaxed pitch wires in the same wiring path are butted over the thin region 49.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising: an insulator layer having one or more wires formed in the insulator layer;
   an etch stop layer in contact with a top surface of the insulator layer and the one or more wires formed in the insulator layer;
   a single bump composed of a single insulator material contacting atop surface of the etch stop layer;
   a continuous wiring structure on a single wiring level and composed of conductive material having a fuse portion over the single bump of the single insulator material and a thicker wiring structure;
   a first barrier layer contacting a bottom surface of the continuous wiring structure including the fuse portion and the thicker wiring structure, an entire top surface and side surfaces of the single insulator material of the single bump, and
   portions of the etch stop layer on both sides of the single bump of the single insulator material; and
   a second barrier layer contacting an upper surface of the continuous wiring structure including the fuse portion and the thicker wiring structure, above the continuous wiring structure.

2. The structure of claim 1, wherein the fuse portion and the thicker wiring structure have a planar surface.

3. The structure of claim 2, wherein the fuse portion has a thickness of about 0.5 µm to about 1.0 µm and the thicker wiring structure has a thickness of about 3.0 µm to about 4.0 µm.

4. The structure of claim 1, wherein one of the one or more wires formed in the insulator layer is a crack stop structure which is directly under the single bump of the single insulator material and the fuse portion which is thinner than the thicker wiring structure.

5. The structure of claim 4, wherein the etch stop layer is a nitride material between the single bump of the single insulator material and the crack stop structure.

6. The structure of claim 5, wherein the second barrier layer is directly on the planar surface of the thinner fuse portion and the thicker wiring structure.

7. The structure of claim 6, wherein the first barrier layer and the second barrier layer are Ti or TiN.

8. The structure of claim 2, wherein the conductive material is Al or AlCu.

9. The structure of claim 2, wherein the conductive material is Cu, formed on a seed layer of Ta.

10. The structure of claim 1, wherein:
one of the one or more wires formed in the insulator layer is a crack stop structure under the single bump of the single insulator material, the crack stop structure aligning with the fuse portion and being on a different wiring level than the continuous wiring structure;
another of the one or more wires formed in the insulator layer is a wiring structure under the thicker wiring structure and on a same wiring level as the crack stop structure; and
the etch stop layer is a capping material over both the crack stop structure and the wiring structure, the capping material over the crack stop structure being an intervening layer directly in contact and between the crack stop structure and the single bump of the single insulator material.

11. The structure of claim 1, wherein:
one of the one or more wires formed in the insulator layer is a crack stop structure under the single bump of the single insulator material, the crack stop structure aligning with the fuse portion and being on a different wiring level than the continuous wiring structure;
another of the one or more wires formed in the insulator layer is a wiring structure under the thicker wiring structure and on a same wiring level as the crack stop structure; and
the etch stop layer is a nitride material extending over the crack stop structure, the wiring structure and dielectric material in which the crack stop structure and wiring structure are formed within, and below the single bump of the single insulator material.

12. The structure of claim 1, wherein:
one of the one or more wires formed in the insulator layer is a crack stop structure under the single bump of the single insulator material;
another of the one or more wires formed in the insulator layer is a wiring structure under the thicker wiring structure and on a same wiring level as the crack stop structure, wherein
the wiring structure and the crack stop structure are composed of conductive material of Al or AlCu or Cu,
the continuous wiring structure is on a different wiring level than the crack stop structure and the wiring structure,
the crack stop structure and the wiring structure are on a same wiring level,
the fuse portion is a thinner portion directly over the single bump of the single insulator material than remaining portions of the continuous wiring structure,
the wiring structure is directly underneath a thicker portion of the continuous wiring structure, and
the crack stop structure aligns with the fuse portion.

13. A structure comprising:
a single bump of single insulator material contacting an underlying insulator layer;
a continuous wiring structure with a planar surface, the continuous wiring structure being composed of conductive material with a thinner fuse portion directly over the single bump of single insulator material and a thicker overpass wiring structure;
a wiring structure under the single bump of the single insulator material and within the underlying insulator layer, the wiring structure aligning with the thinner fuse portion, the wiring structure being located on a different wiring level than the continuous wiring structure;
a layer of first barrier contacting the underlying insulator layer and an entire top surface of the single insulator material and vertical sides of the single insulator material.

14. The structure of claim 13, wherein the wiring structure is a crack stop structure under the single bump of the single insulator material and the thinner fuse portion.

15. The structure of claim 13, wherein the first layer of barrier material is directly underneath and contacting the conductive material, and a second layer of the barrier material is directly on and contacting the planar surface of the thinner fuse portion and the thicker overpass wiring structure.

16. The structure of claim 15, wherein the conductive material is Al or AlCu or Cu, the wiring structure is capped with a capping layer, which is an intervening layer between the bump of insulator material and the wiring structure, and the continuous wiring structure is on a single wiring level, and further comprising a second wiring structure on a same wiring level as the wiring structure and which is aligned with the thicker overpass wiring structure.

17. The structure of claim 13, wherein the conductive material is Cu, formed on a seed layer of Ta.

18. The structure of claim 13, further comprising:
a second wiring structure under the thicker overpass wiring structure and on a same wiring level as the wiring structure, wherein
the wiring structure is a crack stop structure,
the second wiring structure and the crack stop structure are composed of conductive material of Al or AlCu or Cu,
the continuous wiring structure is on a different wiring level than the crack stop structure and the second wiring structure,
the thinner fuse portion is directly over the single bump of the single insulator material,
the second wiring structure is directly underneath a thicker portion of the continuous wiring structure, and
the crack stop structure aligns with the thinner fuse portion and is on a different wiring level than the continuous wiring structure.

* * * * *

UNITED STATES PATENT AND TRADEMARK OFFICE
CERTIFICATE OF CORRECTION

PATENT NO. : 10,910,308 B2
APPLICATION NO. : 15/975041
DATED : February 2, 2021
INVENTOR(S) : Pekarik et al.

It is certified that error appears in the above-identified patent and that said Letters Patent is hereby corrected as shown below:

In the Claims

In Claim 1, Line 33 at Column 6, change "atop" to "a top".
In Claim 13, Line 13 at Column 8, add "and" after "structure".

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*